(12) United States Patent
He

(10) Patent No.: US 8,495,555 B2
(45) Date of Patent: Jul. 23, 2013

(54) COMPUTER AIDED DESIGN SYSTEM AND METHOD

(75) Inventor: Zheng-Yu He, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 0 days.

(21) Appl. No.: 13/471,783

(22) Filed: May 15, 2012

(65) Prior Publication Data

US 2013/0132926 A1 May 23, 2013

(30) Foreign Application Priority Data

Nov. 17, 2011 (CN) .......................... 2011 1 0365471

(51) Int. Cl.
G06F 17/50 (2006.01)
(52) U.S. Cl.
USPC .......................................... 716/137; 716/105
(58) Field of Classification Search
USPC .......................................................... 716/137
See application file for complete search history.

(56) References Cited

U.S. PATENT DOCUMENTS

| | | | | |
|---|---|---|---|---|
| 2004/0010388 A1* | 1/2004 | Ahrikencheikh et al. | ..... | 702/121 |
| 2004/0012926 A1* | 1/2004 | Wanes et al. | ................... | 361/715 |
| 2004/0143806 A1* | 7/2004 | Kodama et al. | .................... | 716/5 |
| 2009/0090465 A1* | 4/2009 | Vasoya | .......................... | 156/280 |
| 2012/0042297 A1* | 2/2012 | Sheng | ........................... | 716/136 |

* cited by examiner

*Primary Examiner* — Thuan Do
*Assistant Examiner* — Mohammed Alam
(74) *Attorney, Agent, or Firm* — Altis Law Group, Inc.

(57) ABSTRACT

A computer aided design system comprises an interface creating module, a first calculating module, a dividing module and a second calculating module. The interface module creates a parameter setting interface to display the proposed design on the screen of the device formed with nets and cline segments and select at least one net in response to the user's operation. The first calculating module calculates the length of the cline segments of the potential net in order based on the coordinates of the cline segments and generates a dividing signal. The dividing module divides the cline segments into a first team and a second team based on the compared result with a predetermined width according to the dividing signal. The second calculating module adds the calculated cline segments length in the first team and in the second team to obtain a first length and a second length.

20 Claims, 5 Drawing Sheets

COMPUTER AIDED DESIGN SYSTEM AND METHOD

BACKGROUND

1. Technical Field

The present disclosure relates to printed circuit board layout systems, particularly, to checking dimensions of copper traces designed on the board.

2. Description of Related Art

In designing layouts for electronic parts such as a printed circuit board (PCB), a collection of terminals or at least two terminals connected together are called a net. The net is composed of at least one or a plurality of copper traces, called cline segments, connecting the terminals. The width of the cline segment must be designed to be a predetermined width. In some special area, a plurality of cline segments is designed with a width less than the predetermined value to contain all the cline segments. The part of cline segments with the width less than the predetermined width is called breakout/breakin part. The total length of the breakout/breakin part must be less than a predetermined length, and the user has to manually check the length of the breakout/breakin part which is complex and time consuming.

Therefore, there is room for improvement in the art.

BRIEF DESCRIPTION OF THE FIGURE

Many aspects of the embodiments can be better understood with reference to the following drawings. The components in the drawings are not necessarily drawn to scale, the emphasis instead being placed upon clearly illustrating the principles of the PCB layout system and method thereof. Moreover, in the drawings, like reference numerals designate corresponding parts throughout the several views.

DETAILED DESCRIPTION

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage system. Embodiments of the present disclosure will be described with reference to the drawings.

Figure 1:
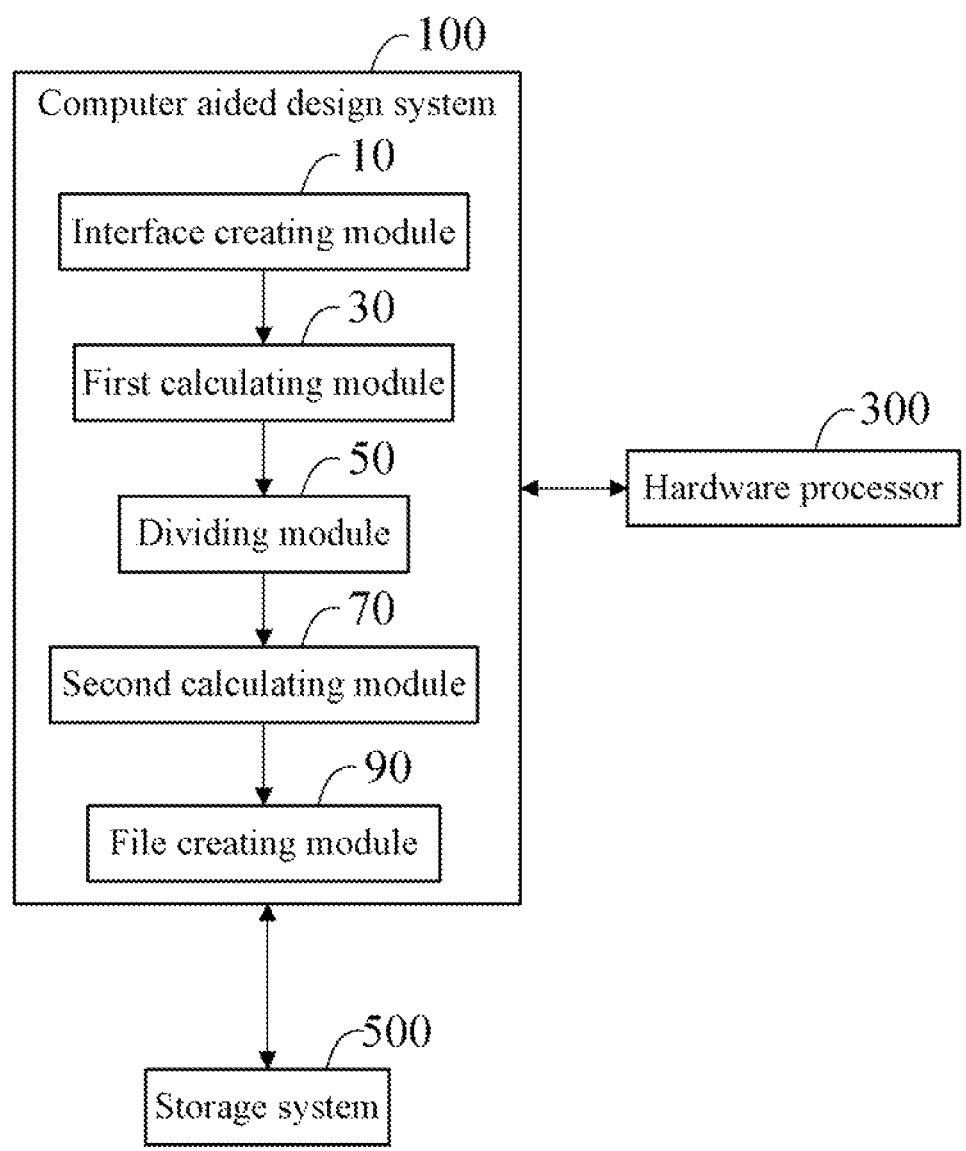
FIG. 1 is a block diagram of a device in accordance with an embodiment.
Figure 4:
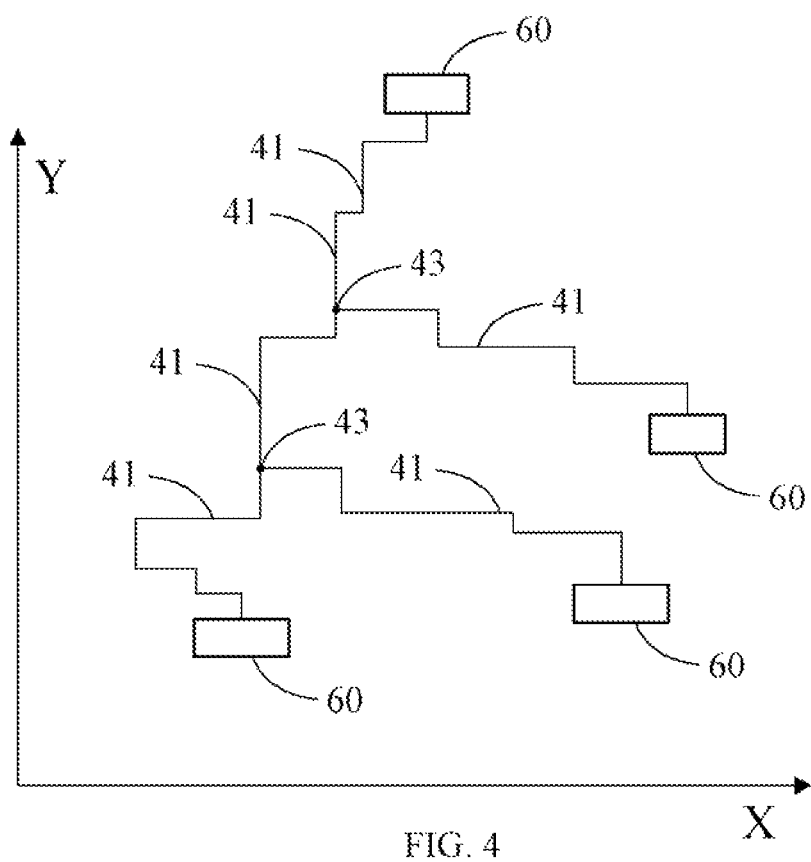
FIG. 4 is a schematic diagram of a non-point-to-point type net displayed on the screen of a computer aided design system of the device of FIG. 1.

FIG. 1 shows a device 1 such as a computer including a computer aided design system 100, a hardware processor 300 and a storage system 500. FIG. 4 shows a net 40 connecting at least two electronic parts 60 is composed of a plurality of cline segments 41. The net 40 includes a point-to-point type and a non-point-to-point type. The point-to-point type net 40 is connected with two electronic parts 60. The non-point-to-point type net 40 is connected with at least three electronic parts 60 and at least one corresponding node 43. The device 1 includes a grid with Cartesian rectangular coordinates or XY axes for specifically identifying locations of the electronic parts and nets in the design.

The computer aided design system 100 includes an interface creating module 10, a first calculating module 30, a dividing module 50, a second calculating module 70, and a file creating module 90. In the embodiment, the computer aided design system 100 is used in a PCB layout system to create a file by respectively measuring the length of the cline segments 41 of each net of PCB layouts and checking for discrepancies from what is required of a PCB design. The modules 10-90 may comprise computerized code in the form of one or more programs that are stored in the storage system 500. The computerized code includes instructions that are executed by the at least one hardware processor to provide functions for modules 10-90.

The hardware processor 300 executes one or more computerized codes of the device 1 and other applications, to provide the functions of the device 1.

The storage system 500 may be a memory system of the device 1, and also may be an external storage card, such as a smart media (SM) card, or secure digital (SD) card, for example. The storage system 500 stores the beginning coordinates and the ending coordinates of each cline segment 41.

Figure 2:
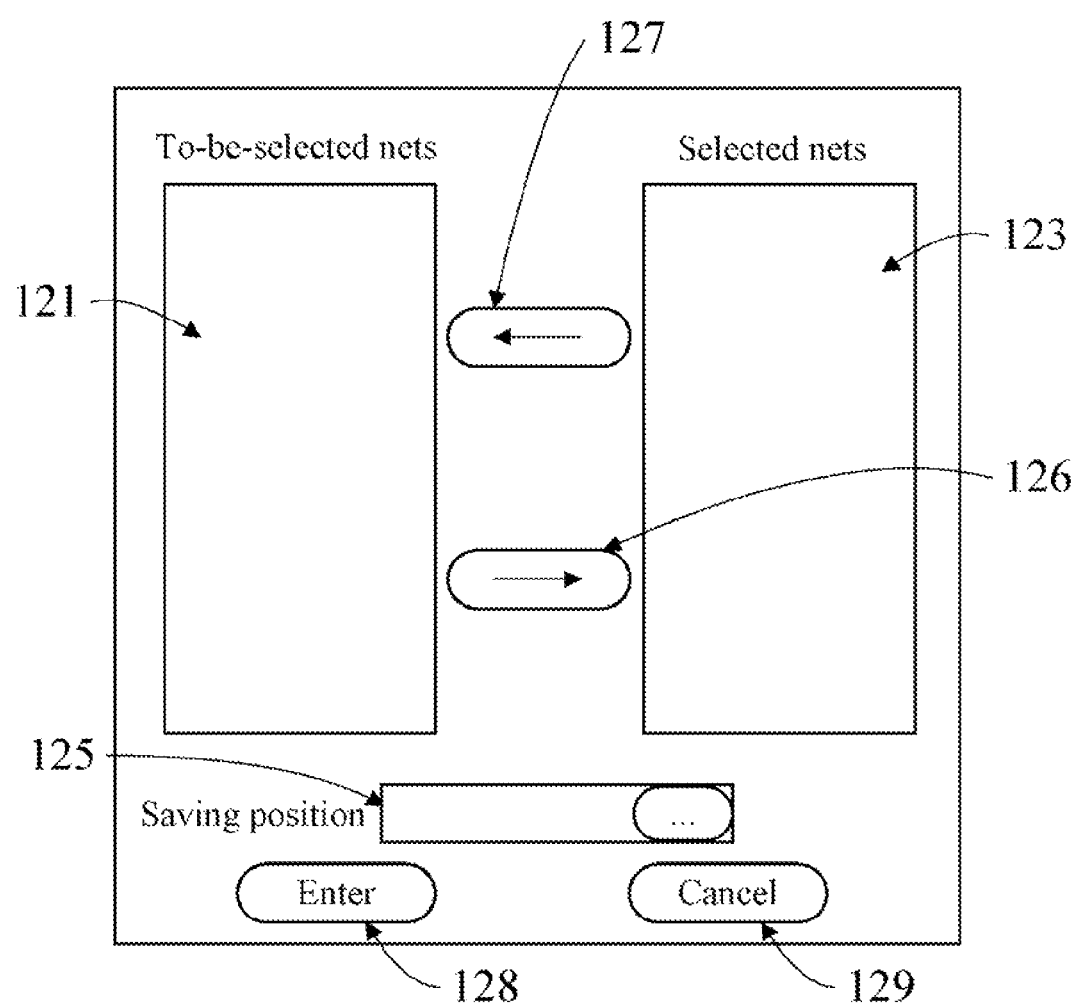
FIG. 2 is a schematic diagram showing a parameter setting window displayed on the screen of a computer aided design system of the device of FIG. 1.

As shown in FIG. 2, the interface creating module 10 provides a parameter setting interface 12 on the screen (not shown) of the device 1, through which the user can choose the to-be-checked nets 40 and set the saving position of the created file. In the embodiment, the parameter setting interface 12 includes a to-be-selected net displaying box 121, a selected net displaying box 123, a saving position setting box 125, an add button 126, a delete button 127, an enter button 128 and a cancel button 129. The to-be-selected net displaying box 121 is used for displaying the name of the to-be-selected nets 40 of the PCB layout design. The selected net displaying box 123 is used for displaying the name of the selected net 40 of the PCB layout design. The saving position setting box 125 is used for setting the saved position of the created file according to the user's operation. When the add button 126 is clicked, the name of the selected net 40 in the to-be-selected net displaying box 121 is added to and displayed in the selected net displaying box 123 according to the user's operation. When the delete button 126 is clicked, the name of the selected net 40 in the selected net displaying box 123 moves to the to-be-selected net displaying box 121 according to the user's operation. When the enter button 128 is clicked, a first obtaining signal is generated, and the name of the selected net 40 in the selected net displaying box 123 and the first obtaining signal are transmitted to the calculating module 30. When the cancel button 208 is clicked, the parameter setting interface 12 exits.

Figure 3:
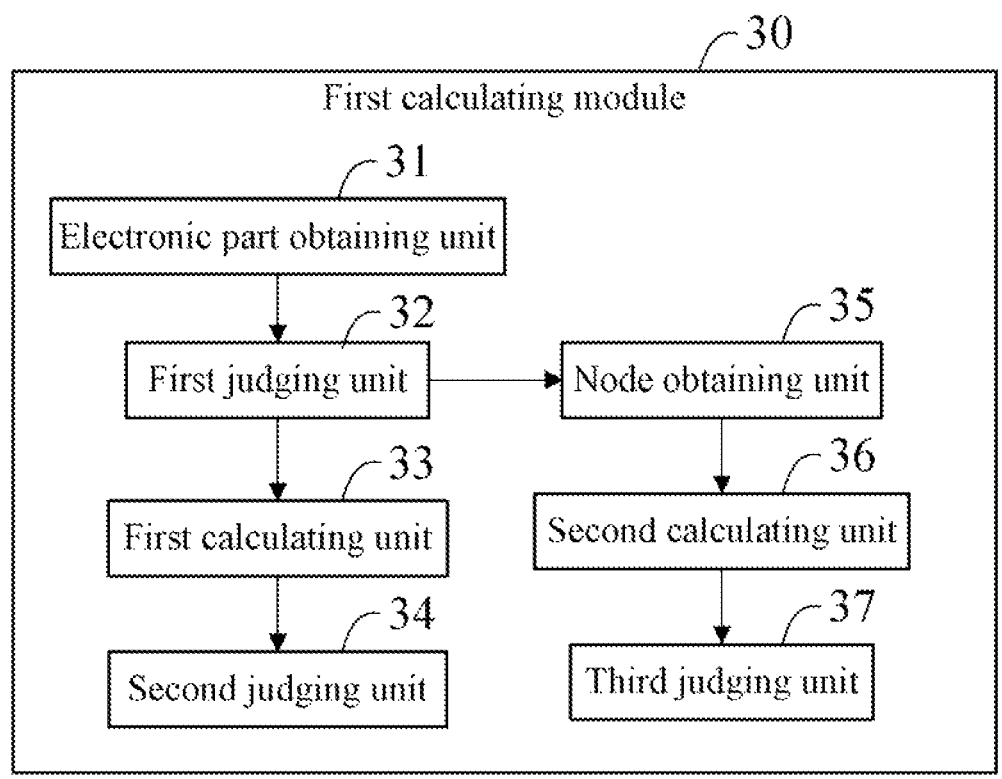
FIG. 3 is a schematic diagram of a calculating module of the computer aided design system of the device of FIG. 1.

As shown in FIGS. 3-4, the first calculating module 30 calculates the length of the cline segment 41 of the selected net 40 being subjected to calculation. When the calculating selected net 40 is a point-to-point type, the first calculating module 30 calculates the cline segments 41 between two electronic parts 60. When the calculating selected net 40 is a non-point-to-point type, the first calculating module 30 calculates the length of the cline segments 41 set between the electronic parts 60 and the adjacent node 43. The first calculating module 30 includes an electronic part obtaining unit 31, a first judging unit 32, a first calculating unit 33, a second judging unit 34, a node obtaining unit 35, a second calculating unit 36, and a third judging unit 37.

The part obtaining unit 31 obtains the number and the coordinates of the electronic part 60 connected with the selected net 40 being subjected to calculation according to the first obtaining signal and the obtained name of the selected nets 40.

The first judging unit 32 judges whether the number of the electronic part 60 is equal to a predetermined value. If the number of the electronic part 60 is equal to the predetermined value, the first judging unit 32 generates a first calculating signal; if the number of the electronic part 60 is more than the predetermined value, the first judging unit generating a second obtaining signal. In the embodiment, the predetermined value is two.

The first calculating unit 33 calculates the length of each cline segment 41 between the two electronic parts 60. In the embodiment, the first calculating unit 33 sets the coordinates of one electronic part 60 connected with the selected net 40 being subjected to calculation as a beginning coordinates of the to-be-calculated cline segment 41, obtains the ending coordinates of the to-be-calculated cline segment 41, and calculates the length of the to-be-calculated cline segment 41 based on the beginning coordinates and the ending coordinates. Then the first calculating unit 33 sets the ending coordinates of the calculated cline segment 41 as the beginning coordinates of the next to-be-calculated cline segment 41, obtains the ending coordinates of the next to-be-calculated cline segment 41, and calculates the length of the next to-be-calculated cline segment 41 based on the beginning coordinates and the ending coordinates. The first calculating unit 33 accomplishes the calculation of the length of each cline segment 41 until the ending coordinates arrive at the coordinates of the other electronic part 60.

The second judging unit 34 judges whether the ending coordinates of the calculating cline segment are the same as the coordinates of the other electronic part 60, and generates a dividing signal when the ending coordinates of the calculating cline segment are the same as the coordinates of the other electronic part 60.

The node obtaining unit 35 obtains the number and the coordinates of the nodes 43 on the selected net 40 being subjected to calculation according to the second obtaining signal. In the embodiment, the node 43 is simultaneously connected with at least three cline segments 41.

The second calculating unit 36 calculates the length of each cline segment 41 set between an electronic part 60 and the adjacent node 43 corresponding to the electronic part 60, and adds up the node calculation times. In the embodiment, the second calculating unit 36 sets the coordinates of one electronic part 60 connected with the selected net 40 being subjected to calculation as a beginning coordinates of the to-be-calculated cline segment 41, obtains the ending coordinates of the to-be-calculated cline segment 41, and calculates the length of the cline segment 41 based on the beginning coordinates and the ending coordinates. Then the second calculating unit 36 sets the ending coordinates of the calculated cline segment 41 as the beginning coordinates of the next to-be-calculated cline segment 41, obtains the ending coordinates of the to-be-calculated cline segment 41, and calculates the length of the cline segment 41 based on the beginning coordinates and the ending coordinates. The second calculating unit 36 accomplishes the calculation of the length of each cline segment 41 set between one electronic part 60 and the adjacent node 43 corresponding to the electronic part 60 until the ending coordinates are the same as the coordinates of the adjacent node 43 corresponding to the electronic part 60. The second calculating unit 36 adds up the node calculation times.

The third judging unit 37 judges whether the accumulated node calculation times is equal to the obtained node number of the selected net 40 being subjected to calculation and generates a dividing signal when the accumulated node calculation times is equal to the obtained node number of the selected net 40 being subjected to calculation.

The dividing module 50 presets a predetermined width. The dividing module 50 divides the calculated cline segments 41 into a first team with a width thereof being less than the predetermined width and a second team with a width thereof being equal to the predetermined width.

The second calculating module 70 adds all the calculated cline segment length in the first team and the second team respectively to obtain a first length and a second length.

The file creating module 90 collects the information of the net 40 being subjected to calculation to create an information file in a predetermined format. In the embodiment, the information is arranged in a connective relationship and includes the first length, the second length, the length of each calculated cline segment 41, and the coordinates of each calculated cline segment 41.

Figure 5:
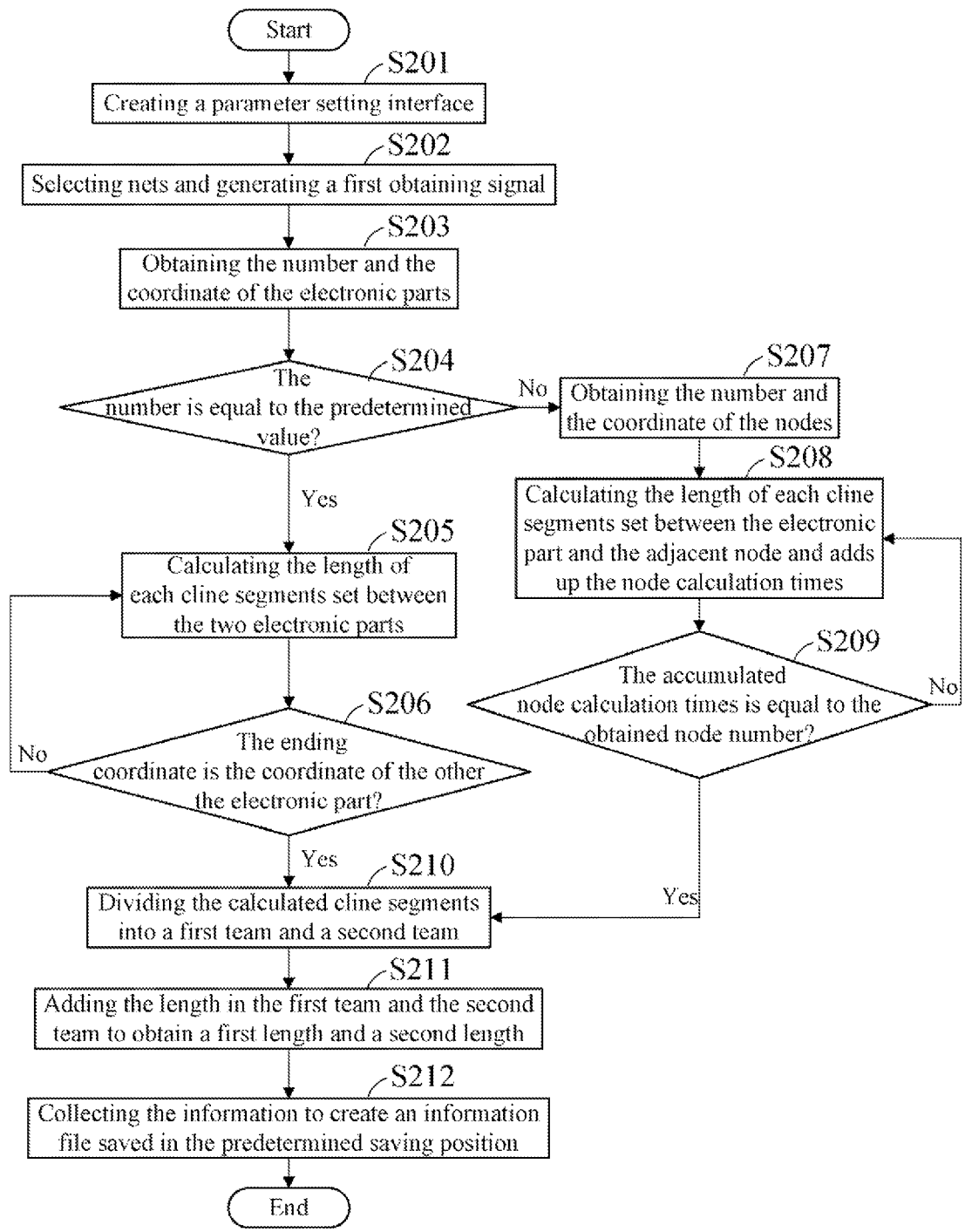
FIG. 5 is a flowchart of a checking method in accordance with the embodiment.

Referring to FIG. 5, a calculating method is used for calculating the first length and the second length of the nets 40 in the PCB layouts of the computer aided design system in the device 1. A net 40 connects with at least two electronic parts 60 and is composed of a plurality of cline segments 41. The net 40 includes a point-to-point type and a non-point-to-point type. The point-to-point type net 40 connects with two electronic parts 60. The non-point-to-point type net 40 connects at least three electronic parts 60 and at least one corresponding node 43. The calculating method includes the following steps.

In step S201, the interface creating module creates a parameter setting interface for setting the parameters. In the embodiment, the parameter setting interface 12 includes a to-be-selected net displaying box 121, a selected net displaying box 123, a saving position setting box 125, an add button 126, a delete button 127, an enter button 128 and a cancel button 129. The to-be-selected net displaying box 121 is used for displaying the name of the to-be-selected nets 40 of the PCB layout design. The selected net displaying box 123 is used for displaying the name of the selected net 40 of the PCB layout design. The saving position setting box 125 is used for setting the saved position of the created file according to the user's operation.

In step S202, the interface creating module 10 selects the nets 40 in the parameter setting interface 12 in response to the user's operation and generates a first obtaining signal. In the embodiment, when the add button 126 is clicked, the name of the selected net 40 in the to-be-selected net displaying box 121 is added to and displayed in the selected net displaying box 123 according to the user's operation. When the delete button 126 is clicked, the name of the selected net 40 in the selected net displaying box 123 moves to the to-be-selected net displaying box 121 according to the user's operation. When the enter button 128 is clicked, a first obtaining signal is generated, and the name of the selected net 40 in the selected net displaying box 123 and the first obtaining signal are transmitted to the calculating module 30. When the cancel button 208 is clicked, the parameter setting interface 12 exits.

In step S203, the element part obtaining unit 31 obtains the number and the coordinates of the element parts connected with the selected net 40 being subjected to calculation according to the first obtaining signal.

In step S204, the first judging unit 32 judges whether the number of the electronic parts is equal to a predetermined value. If the number of the electronic parts is equal to the predetermined value, the net is a point-to-point type net and the procedure goes to S205; if the number of the electronic parts is more than the predetermined value, the net is a non-point-to-point type net and the procedure goes to S207. In the embodiment, the predetermined value is two.

In step S205, the first calculating unit 33 calculates the length of each cline segment 41 between the two electronic parts 60 according to the first obtaining signal and the obtained name of the selected nets 40. In the embodiment, the first calculating unit 33 sets the coordinates of one electronic part 60 connected with the selected net 40 being subjected to calculation as a beginning coordinates of the to-be-calculated cline segment 41 which connected to the electronic part 60, obtains the ending coordinates of the to-be-calculated cline segment 41, and calculates the length of the to-be-calculated cline segment 41 based on the beginning coordinates and the ending coordinates. Then the first calculating unit 33 sets the ending coordinates of the calculated cline segment 41 as the beginning coordinates of the next to-be-calculated cline segment 41, obtains the ending coordinates of the next to-be-calculated cline segment 41, and calculates the length of the next to-be-calculated cline segment 41 based on the beginning coordinates and the ending coordinates. The first calculating unit 33 accomplishes the calculation of the length of each cline segment 41 until the ending coordinates are the same as the coordinates of the other electronic part 60.

In step S206, the second judging unit 34 judges whether the ending coordinates of the calculating cline segment 41 are the same as the coordinates of the other electronic parts 60. If the ending coordinates of the calculating cline segment 41 are the same as the coordinates of the other electronic parts 60, the second judging unit 34 generates a dividing signal and the procedure goes to S210; if the ending coordinates of the calculating cline segment 41 are not the same as the coordinates of the other electronic parts 60, the procedure goes to S205.

In step S207, the node obtaining unit 35 obtains the number and the coordinates of the nodes 43 on the selected net 40 being subjected to calculation according to the second obtaining signal. In the embodiment, the node 43 is simultaneously connected with at least three cline segments 41.

In step S208, the second calculating unit 36 calculates the length of each cline segment 41 set between an electronic part 60 and the adjacent node 43 corresponding to the electronic part 60 and adds up the node calculation times. In the embodiment, the second calculating unit 36 sets the coordinates of one electronic part 60 connected with the selected net 40 being subjected to calculation as a beginning coordinates of the to-be-calculated cline segment 41, obtains the ending coordinates of the to-be-calculated cline segment 41, and calculates the length of the cline segment 41 based on the beginning coordinates and the ending coordinates. Then the second calculating unit 36 sets the ending coordinates of the calculated cline segment 41 as the beginning coordinates of the next to-be-calculated cline segment 41, obtains the ending coordinates of the to-be-calculated cline segment 41, and calculates the length of the cline segment 41 based on the beginning coordinates and the ending coordinates. The second calculating unit 36 accomplishes the calculation of the length of each cline segment 41 set between one electronic part 60 and the adjacent node 43 which corresponds to the electronic part 60 until the ending coordinates are the same as the coordinates of the adjacent node 43 and adds up the node calculation times.

In step S209, the third judging unit 37 judges whether the accumulated node calculation times is equal to the obtained node number of the selected net 40 being subjected to calculation. If the accumulated node calculation times is equal to the obtained node number of the selected net 40 being subjected to calculation, the third judging unit 37 generates a dividing signal and the procedure goes to S210; if the accumulated node calculation times is less than the obtained node number of the selected net 40 being subjected to calculation, the procedure goes to S208.

In step S210, the dividing module 50 divides the calculated cline segments 41 into a first team with a width thereof being less than the predetermined width and a second team with a width thereof being equal to the predetermined width.

In step S211, the second calculating module 70 adds all the calculated cline segments length in the first team and in the second team respectively to obtain a first length and a second length.

In step S212, the file creating module 90 collects the information of the calculated net 40 to create an information file in a predetermined format and saves the created information file in the set saving position of the parameter setting interface 12. In the embodiment, the information is arranged in a connective relationship includes the first length, the second length, the length and the coordinates of each calculated cline segment 41.

In use, the first length and the second length of the selected net are automatically calculated by the computer and saved as an information file in the predetermined saving position, such that the calculation operation becomes simpler and saves time.

While various exemplary and preferred embodiments have been described, it is to be understood that the disclosure is not limited thereto. On the contrary, various modifications and similar arrangements (as would be apparent to those skilled in the art) are also intended to be covered. Therefore, the scope of the appended claims should be accorded the broadest interpretation so as to encompass all such modifications and similar arrangements.

What is claimed is:

1. A computer aided design system of a device used in a printed circuit board layout system, the device comprises at least one hardware processor and a storage system to store a contact list and one or more network applications; the computer aided design system comprises a plurality of nets and one or more programs, the one or more programs stored in the storage system and executable by the at least one hardware processor, the one or more programs comprising:
an interface creating module executed by the hardware processor and configured to create a parameter setting interface on a screen of the device to display a design with a plurality of to-be-calculated nets and select at least one net of the design in response to a user's operation, wherein each of the to-be-calculated nets is composed of a plurality of cline segments with different widths directly connected in series;
a first calculating module configured to calculate the length of the cline segments of the selected net being subjected to calculation based on the coordinates of the cline segments and generating a dividing signal;
a dividing module configured to divide the calculated cline segments belonging to the same selected net into a first team and a second team based on the compared result with a predetermined width according to the dividing signal; and
a second calculating module configured to respectively add the calculated cline segments length in the first team and the second team to obtain a first length and a second length.

2. The computer aided design system of claim 1, wherein the width of the cline segments in the first team is less than the predetermined width, the width of the cline segments in the second team is equal to the predetermined width.

3. The computer aided design system of claim 1, wherein the net includes a point-to-point type and a non-point-to-point type; the point-to-point type net connects with two electronic parts, and the non-point-to-point type net connects with at least three electronic parts and at least one node.

4. The computer aided design system of claim 3, wherein the interface creating module further generates a first obtaining signal in response to the user's operation; the calculating module comprise an element part obtaining unit, and a first judging unit; the element part obtaining unit obtains the number and the coordinates of the electronic parts connected with the selected being subjected to calculation net according to the first obtaining signal; the first judging unit judges whether the number of the electronic parts is equal to the predetermined value.

5. The computer aided design system of claim 4, wherein the calculating module further comprise a first calculating unit; if the number is equal to the predetermined value, the calculating selected net is a point-to-point type net and generates a first calculating signal; the first calculating unit calculates the cline segments between the two electronic parts based on the connection relationship from one of the electronic parts to the other electronic part in response to the first calculating signal.

6. The computer aided design system of claim 5, wherein the calculating module further comprises a second judging unit, the second judging unit judges whether the ending coordinates of the calculating cline segment are the same as the coordinates of the other electronic part and generates a dividing signal when the ending coordinates of the calculating cline segment are the same as the coordinates of the other electronic part.

7. The computer aided design system of claim 4, wherein the calculating module further comprises a node obtaining unit and a second calculating unit, if the number is more than the predetermined value, the calculating selected net is a non-point-to-point type net and generates a second obtaining signal; the node obtaining unit obtains the number and the coordinates of the node on the selected net being subjected to calculation according to the second obtaining signal and generates a second calculating signal; the second calculating unit calculates the cline segments between the electronic parts and the adjacent node corresponding to the electronic part based on the connection relationship from one of the electronic parts to the adjacent node and accumulate the node calculation times in response to the second calculating signal.

8. The computer aided design system of claim 7, wherein the calculating module further comprises a third judging unit, the third judging unit judges whether the accumulated node calculation times is equal to the obtained node number of the selected net being subjected to calculation and generates a dividing signal when the accumulated node calculation times is equal to the number of the node on the selected net being subjected to calculation.

9. The computer aided design system of claim 1, wherein the parameter setting interface further sets a predetermined saving position in response to the user's operation; the computer aided design system further comprise a file creating module; the file creating module collects the information of the calculated net to create an information file in a predetermined format saved in the predetermined saving position.

10. The computer aided design system of claim 9, wherein the information arranged in a connection relationship includes the first length, the second length, the length and the coordinates of each calculated cline segment 41.

11. A calculating method for the computer aided design system of a device in a printed circuit board layout, the computer aided design system capable of executed by a hardware processor to perform instructions stored in a storage system, the device comprising and one or more network applications and a contact list; the checking method comprising:
creating a parameter setting interface on the screen of the device executed by the hardware processor and displaying a design with a plurality of nets, wherein each of the nets is composed of a plurality of cline segments with different widths directly connected in series;
selecting at least one net of the design according to a user's operation;
calculating the length of the cline segments of the selected net being subjected to calculation based on the coordinates of the cline segments and generating a dividing signal;
dividing the calculated cline segments belonged to the same selected net into a first team and a second team based on the compared result with a predetermined width according to the dividing signal; and
adding the calculated cline segments length in the first team and the second team respectively to obtain a first length and a second length.

12. The method according to claim 11, wherein the width of the cline segments in the first team is less than the predetermined width, the width of the cline segments in second team is equal to the predetermined width.

13. The method according to claim 11, wherein the net includes a point-to-point type and a non-point-to-point type; the point-to-point type net connects with two electronic parts, and the non-point-to-point type net connects with at least three electronic parts and at least one node.

14. The method according to claim 13, wherein the step of calculating the length of the cline segments of the selected net being subjected to calculation further comprising:
obtaining the number and the coordinates of the electronic parts connected with the selected net being subjected to calculation; and
judging whether the number of the electronic parts is equal to the predetermined value.

15. The method according to claim 14, wherein when the number is equal to the predetermined value, the calculating selected net is a point-to-point type net, and calculating the cline segments between the two electronic parts based on the connection relationship from one of the electronic parts to the other electronic part in response to the first calculating signal.

16. The method according to claim 15, wherein the step of calculating the cline segments between the two electronic parts connected with the point-to-point type selected net being subjected to calculation further comprising:
judging whether the ending coordinates of the calculating cline segment are the same as the coordinates of the other electronic part; and
generating a dividing signal when the ending coordinates of the calculating cline segment are the same as the coordinates of the other electronic part.

17. The method according to claim 14, wherein when the number is more than the predetermined value, the calculating selected net is a non-point-to-point type net;
obtaining the number and the coordinates of the node on the selected net being subjected to calculation;
calculating the cline segments between the electronic parts and the adjacent node corresponding to the electronic part based on the connection relationship from one of the electronic parts to the adjacent node; and accumulating the node calculation times.

18. The method according to claim 17, further comprising steps of accumulating the node calculation times further comprising:

judging whether the accumulated node calculation times is equal to the obtained node number of the selected net being subjected to calculation; and generating a dividing signal when the accumulated node calculation times is equal to the obtained node number of the selected net being subjected to calculation.

19. The method according to claim 11, further comprising collecting the information of the calculated net to create an information file in a predetermined format saved on a predetermined position which is set in the parameter setting interface in response to the user's operation.

20. The method according to claim 19, wherein the information arranged in a connection relationship includes the first length, the second length, the length and the coordinates of each calculated cline segment.

* * * * *